(12) United States Patent
Kim

(10) Patent No.: US 7,684,454 B2
(45) Date of Patent: Mar. 23, 2010

(54) HIGH POWER VERTICAL CAVITY SURFACE EMITTING LASER

(75) Inventor: Ki-sung Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/448,839

(22) Filed: Jun. 8, 2006

(65) Prior Publication Data

US 2006/0291515 A1 Dec. 28, 2006

(30) Foreign Application Priority Data

Jun. 28, 2005 (KR) .................. 10-2005-0056074

(51) Int. Cl.
*H01S 5/00* (2006.01)
(52) U.S. Cl. ............. 372/45.011; 372/50.1; 372/45.012
(58) Field of Classification Search ................ None
See application file for complete search history.

(56) References Cited

U.S. PATENT DOCUMENTS

| 5,574,738 | A  | * | 11/1996 | Morgan ................. 372/46.01 |
| 5,719,894 | A  | * | 2/1998  | Jewell et al. ........... 372/45.011 |
| 5,929,462 | A  | * | 7/1999  | Kasukawa et al. ............. 257/18 |
| 6,327,293 | B1 | * | 12/2001 | Salokatve et al. ............. 372/96 |
| 2004/0013154 | A1 | * | 1/2004 | Zheng ......................... 372/96 |
| 2004/0135136 | A1 | * | 7/2004 | Takahashi et al. ............. 257/14 |

FOREIGN PATENT DOCUMENTS

JP 06-237042 A 8/1994
JP 08-139404 A 5/1996

OTHER PUBLICATIONS

Mark Kuznetsov et al., Design and Characteristics of High-Power (>0.5-W CW) Diode-Pumped Vertical-External-Cavity Surface-Emitting Semiconductor Laser with Circular $TEM_{00}$ Beams), IEEE Journal of Selected Topics in Quantum Electronics, col. 5, No. 3, May/Jun. 1999, pp. 561-573.
Chinese Office Action with English Translation for Application No. 2006100908549 dated Mar. 13, 2009.
Burns, et al., High-average-power (>20-W) Nd:YVO4 lasers mode locked by strain-compensated saturable Bragg reflectors, Optical Society of America, vol. 17, No. 6/Jun. 2000/J. Opt. Soc. Am. B., pp. 919-926.

* cited by examiner

*Primary Examiner*—Minsun Harvey
*Assistant Examiner*—Sean Hagan
(74) *Attorney, Agent, or Firm*—Cantor Colburn LLP

(57) ABSTRACT

An improved VECSEL device is provided in which the gain of each of the quantum well layers can be increased in a periodic gain structure. A vertical external cavity surface emitting laser (VECSEL) device comprising: a substrate; a bottom DBR mirror formed on the substrate; a multiple quantum well layer formed on the bottom DBR mirror and comprising: a plurality of quantum well layers; first and second strain compensation layers sequentially formed above and below each of the quantum well layers to gradually relieve the strain of the quantum well layers; a capping layer formed on the multiple quantum well layer; an optical pump radiating a pump beam to the surface of the capping layer; and an external cavity mirror separated from and facing the bottom DBR mirror.

7 Claims, 3 Drawing Sheets

HIGH POWER VERTICAL CAVITY SURFACE EMITTING LASER

CROSS-REFERENCE TO RELATED PATENT APPLICATION

This application claims the benefit of Korean Patent Application No. 10-2005-0056074, filed on Jun. 28, 2005, in the Korean Intellectual Property Office, the disclosure of which is incorporated herein in its entirety by reference.

BACKGROUND OF THE DISCLOSURE

1. Field of the Disclosure

The present disclosure relates to a vertical external cavity surface emitting laser (VECSEL) device, and more in particular, to a VECSEL device with an improved structure to improve the gain of each quantum well layer in a multiple quantum well layer having a periodic gain structure.

2. Description of the Related Art

A vertical cavity surface emitting laser (VCSEL) radiates a single longitudinal beam of light having a very narrow spectrum. The projection angle of the beam is small and thus the coupling efficiency is high. Also, since monolithic integration with other appliances is easy due to the characteristics of the surface light emission, the VCSEL is appropriate as a pumping light source.

However, a conventional VCSEL cannot radiate a single lateral light beam as easily as an edge emitting laser diode (LD). Also, the radiation area should be 10 μm or less for a common single lateral mode operation, and even then the VCSEL enters a multiple mode due to a thermal lens effect as the light output increases. Thus, the maximum power of the output single lateral light is 5 mW.

A vertical external cavity surface emitting laser (VECSEL) provides the advantages of the VCSEL described above and simultaneously achieves a high power operation. The VECSEL has an external mirror in place of the upper DBR of the VCSEL, and thus has an increased gain area and can obtain an output power of 100 mW or more. Recently, a VECSEL device having a periodic gain structure with quantum wells (QW) arranged periodically has been developed to compensate for the disadvantages of surface emitting lasers (SEL) which cannot obtain as much gain as edge emitting lasers because of a lesser gain volume than edge emitting lasers. Also, a VECSEL device has been developed to uniformly pump a large area since electric pumping does not provide uniform carrier injection for a large area.

A strain compensation layer that compensates for strain in the quantum well layer to suppress structural defects in a VECSEL structure having a periodic gain has been suggested by Kuznetsov et al. ["Design and Characteristics of High-power Diode-Pumped Vertical-External-Cavity Surface-Emitting Semiconductor Lasers", Kuznetsov et al. IEEE J. Selected topics in Quantum electronics, Vol. 5(3), p. 561, 1999].

However, in a VECSEL device, the strain compensation layers completely offset strains around the quantum well layers, and when all the strains are offset, the maximum gain of the quantum well layers is lowered. Therefore, a structural improvement of the VECSEL is required in the VECSEL device including the strain compensation layers to obtain the maximum gain of the quantum well layers.

SUMMARY OF THE DISCLOSURE

The present invention may provide an improved vertical external cavity surface emitting laser (VECSEL) device in which the gain of each quantum well layer can be increased in a periodic gain structure.

According to an aspect of the present invention, there is provided a vertical external cavity surface emitting laser (VECSEL) device comprising: a substrate; a bottom DBR mirror formed on the substrate; a multiple quantum well layer formed on the bottom DBR mirror and comprising: a plurality of quantum well layers; first and second strain compensation layers sequentially formed above and below each of the quantum well layers to gradually relieve the strain of the quantum well layers; a capping layer formed on the multiple quantum well layer; an optical pump radiating a pump beam to the surface of the capping layer; and an external cavity mirror separated from and facing the bottom DBR mirror.

The multiple quantum well layer has a periodic gain structure. The quantum well layer is formed of a material selected from the group consisting of InGaAs and GaInAs. The first and second strain compensation layers are formed of a material selected from the group consisting of GaAsP and GaNAs. The capping layer is formed of $Al_xGa_{(1-x)}As$ ($0 \leq x < 1$).

Preferably, barrier layers are respectively interposed between the quantum well layer and the first strain compensation layer, and between the first and second strain compensation layers. The barrier layers are formed of $Al_yGa_{(1-y)}As$ ($0 \leq y < 0.08$). The barrier layers are respectively interposed between the lower DBR mirror and the multiple quantum well layer, and between the multiple quantum well layer and the capping layer.

According to the configuration of the present invention, a VECSEL device is provided in which the gain of the quantum well layers is maximized in a multiple quantum well layer having a periodic gain structure. Therefore, the operating characteristics and reliability of the VECSEL device are ensured.

BRIEF DESCRIPTION OF THE DRAWINGS

The above and other features and advantages of the present invention will be described in detailed exemplary embodiments thereof with reference to the attached drawings in which.

DETAILED DESCRIPTION OF PREFERRED EMBODIMENTS

Figure 1:
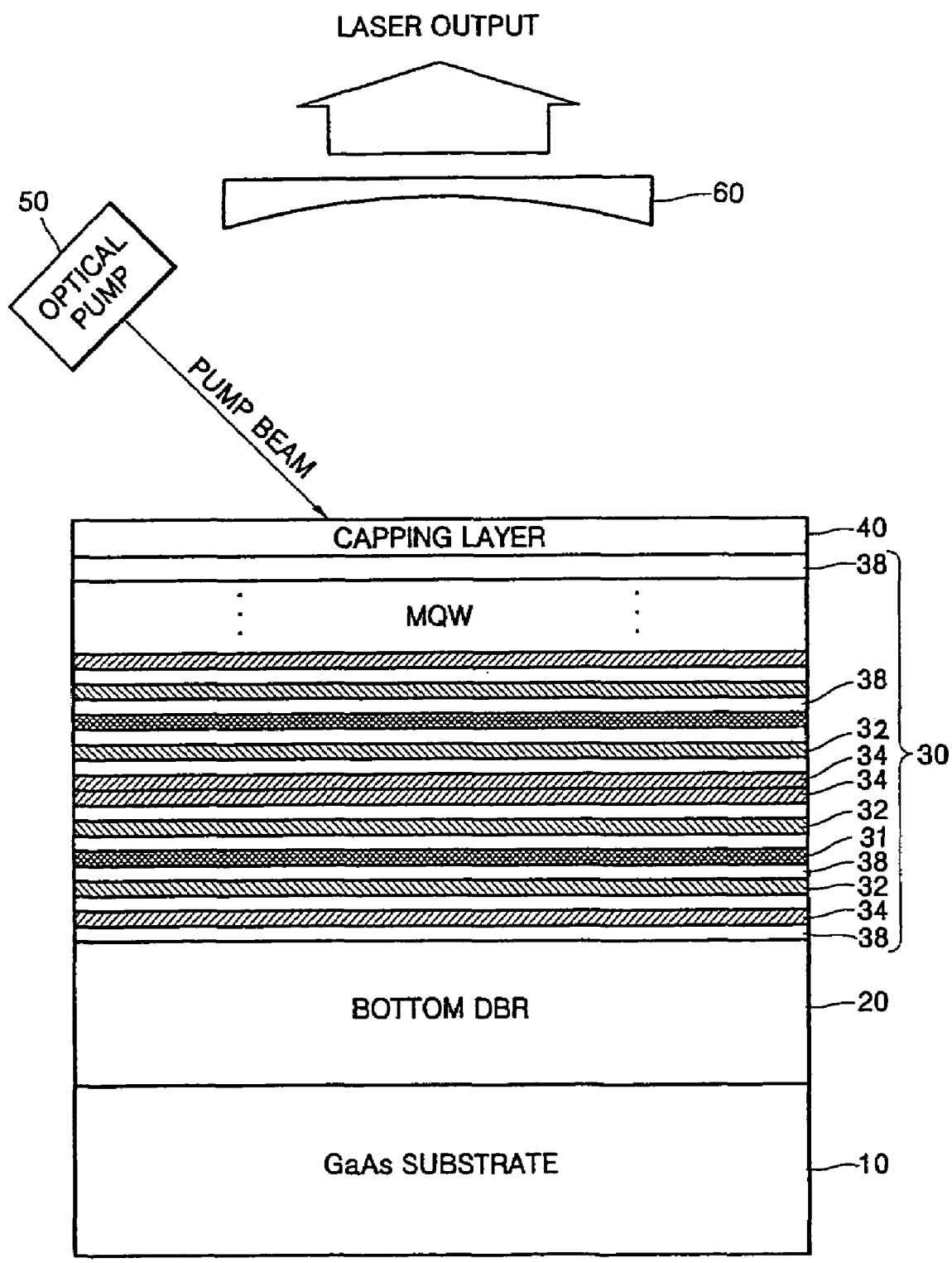
FIG. 1 is a schematic cross-sectional view of a vertical external cavity surface emitting laser (VECSEL) device according to an embodiment of the present invention.

The present invention will now be described more fully in an exemplary manner with reference to the accompanying drawings. In the drawings, the thicknesses of the layers and regions are exaggerated for clarity.

FIG. 1 is a schematic cross-sectional view of a vertical external cavity surface emitting laser (VECSEL) device according to an embodiment of the present invention.

Figure 2:
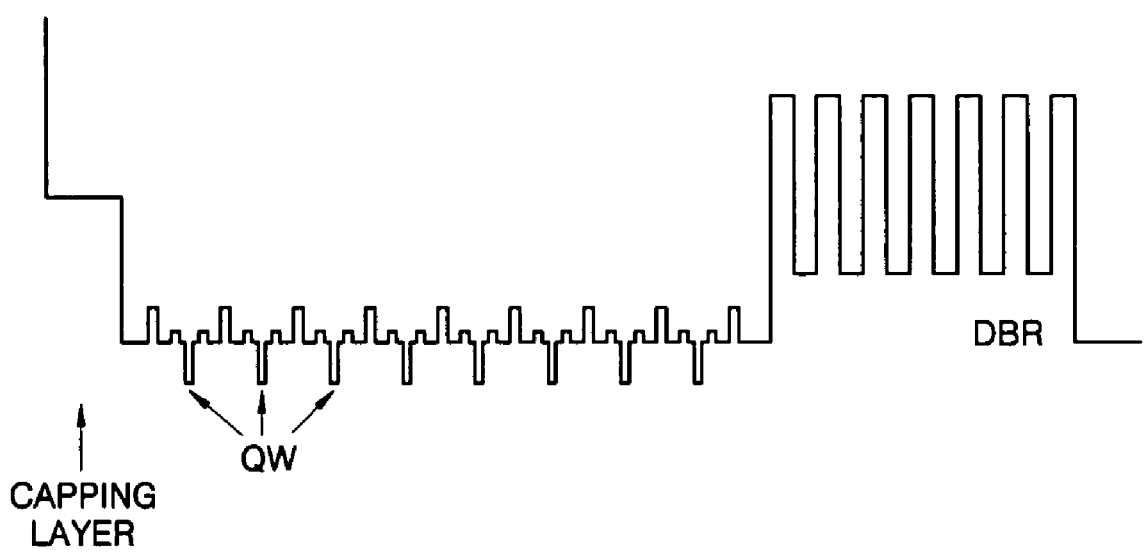
FIG. 2 is a diagram of the energy band of each layer in the VECSEL device of FIG. 1.

FIG. 2 is a diagram of the energy band of each layer in the VECSEL device of FIG. 1.

Referring to FIGS. 1 and 2, a VECSEL device according to the present embodiment includes a bottom DBR mirror 20, a multiple quantum well layer 30, and a capping layer 40 formed sequentially on a substrate 10, an optical pump 50 radiating a pump beam to the surface of the capping layer 40 for pumping, and an external cavity mirror 60 disconnected from the rest of the VECSEL device and facing the bottom DBR mirror 20. The substrate 10 can be formed of a GaAs-type material. The bottom DBR mirror can include alternating AlGaAs layers and GaAs layers. As the material and formation of the substrate 10 and the bottom DBR mirror 20 is well known, the description thereof is being omitted.

The multiple quantum well layer 30 has a periodic gain structure. In detail, the multiple quantum well layer 30 includes a plurality of quantum well layers 31, and first and second strain compensation layers 32 and 34 sequentially formed on the upper and lower sides of the quantum well layers 31. The first and second strain compensation layers 32 and 34 can relieve strain of the quantum well layers 31. That is, the first strain compensation layers 32 that are symmetrically arranged about the quantum well layers 31 offset a portion of the strain of the quantum well layers 31 interposed between the first strain compensation layers 32. The second strain compensation layers 34 disposed symmetrically around the quantum well layers 31 can offset the rest of the strain. Accordingly, a structural defect due to the strain of each of the quantum well layers 31 does not occur in the multiple quantum well layer 30 having a periodic gain structure. Also, when a structure in which the strain of the quantum layers 31 is gradually relieved is employed, the rest of the strain which is not offset remains around the quantum well layers 31. Gain of the quantum well layers 31 can be maximized due to the remaining strain. Also, the remaining strain can be offset and thus be removed around the second strain compensation layers 34.

The quantum well layers 31 are formed of InGaAs or GaInNAs. The first and second strain compensation layers 32 and 34 can be formed of GaAsP or GaNAs. The capping layer 40 can be formed of $Al_xGa_{(1-x)}As$ ($0 \leq x < 1$). Moreover, by controlling the composition ratio and thicknesses of the first and second strain compensation layers 32 and 34, the amount of strain around the quantum well layer 31 can be controlled and the gain of the quantum well layer 31 can be optimized.

A barrier layer 38 can be further interposed between the quantum well layers 31 and the first strain compensation layer 32, and between the first strain compensation layer 32 and the second strain compensation layer 34. The barrier layer 38 can be formed of $Al_yGa_{(1-y)}As$ ($0 \leq y < 0.08$). The barrier layer 38 can be further interposed between the bottom DBR mirror 20 and the multiple quantum well layer 30, and between the multiple quantum well layer 30 and the capping layer 40.

According to an embodiment of the present invention, as strain compensation of the quantum well layers 31 is gradually accomplished, maximum gain can be obtained and a structural defect due to strain can be prevented in a VECSEL device.

EXPERIMENTAL EXAMPLE

Figure 3A:
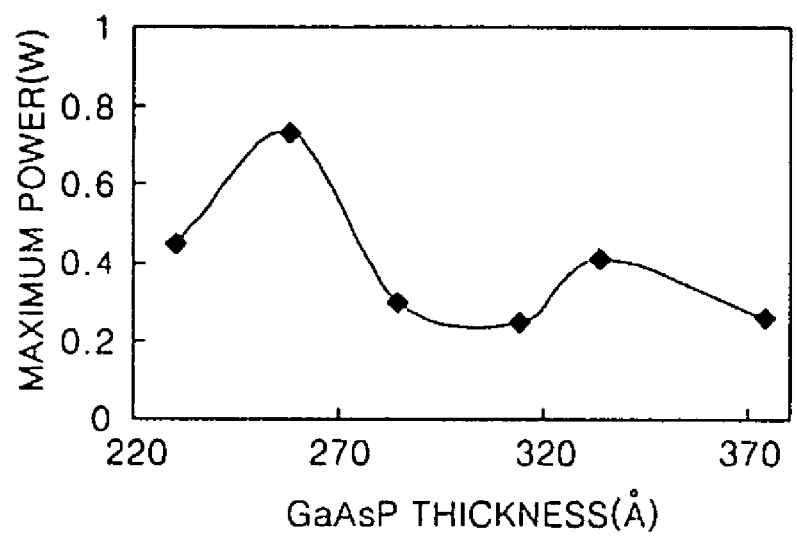
FIGS. 3A and 3B respectively illustrate the maximum power and the threshold pumping power according to the thickness of each GaAsP layer of an optical pump of the VECSEL device.
Figure 3B:
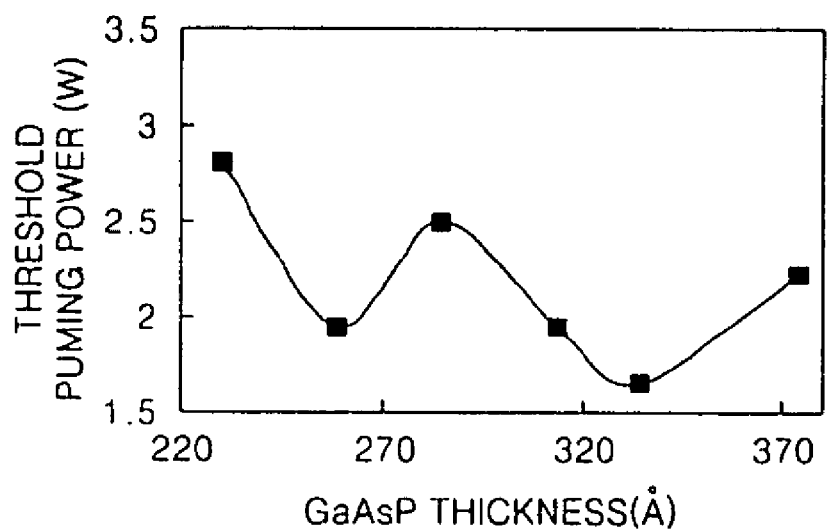

A sample of the VECSEL device with a structure as indicated in Table 1 was prepared, and the maximum power and threshold pumping power of the optical pump according to the thickness of each GaAsP layer were measured. The results are illustrated in FIGS. 3A and 3B.

TABLE 1

VECSEL STRUCTURE LAYER CONSTRUCTION

| LAYER NAME | THICKNESS(nm) | Air t(nm) | PERIODICITY |
|---|---|---|---|
| GaAs | 10.0 | λ | 1 |
| $Al_{0.3}GaAs$ | 305.0 | | 1 |
| GaAs | 130.6 | λ/2 | 1 |
| $GaAs_{0.9}P_{0.1}$ | 17.2 | | 9 |
| GaAs | 1.0 | | |
| $In_{0.28}GaAs$ | 6.1 | λ/2 | |
| GaAs | 1.0 | | |
| $GaAs_{0.9}P_{0.1}$ | 17.2 | | |
| GaAs | 109.6 | | |
| $GaAs_{0.9}P_{0.1}$ | 17.2 | | 1 |
| GaAs | 1.0 | | 1 |
| $In_{0.28}GaAs$ | 6.1 | λ/2 | 1 |
| GaAs | 1.0 | | 1 |
| $GaAs_{0.9}P_{0.1}$ | 17.2 | | 1 |
| GaAs | 130.6 | | 1 |
| AlAs | 885.0 | | DBR (30 pair) |
| $Al_{0.2}GaAs$ | 770.0 | | |

An InGaAs quantum well layer was formed to a thickness of 60 Å, and the composition ratio of indium (In) was 28%. Referring to FIGS. 3A and 3B, it is 15 predictable that strain is completely compensated when the thickness of the GaAsP layer is about 280 Å. When the thickness of the GaAsP layer is greater than 280 Å, the InGaAs quantum well layer experiences a tensile strain. When the thickness of GaAsP layer is less than 280 Å, the InGaAs quantum well layer experiences a compressive strain. Also, the pumping power was found to be lowest when the GaAsP layer had a predetermined thickness. Accordingly, the maximum power of the VECSEL device increases at a low pumping power.

According to an embodiment of the present invention, a VECSEL device is not prone to structural defects since the strain in the quantum well layers is relieved and has an improved structure maximizing the gain of the quantum well layers in a multiple quantum well layer having a periodic gain structure. Therefore, the operating characteristic and reliability of the VECSEL device are ensured.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A vertical external cavity surface emitting laser (VECSEL) device comprising:

a substrate;

a bottom DBR mirror formed on the substrate;

a multiple quantum well layer formed on the bottom DBR mirror and including a plurality of quantum well layers, wherein each quantum well layer comprises a pair of first strain compensation layers and a pair of second strain compensation layers, wherein said each quantum well layer is interposed between the pair of first strain compensation layers and wherein the pair of first strain layers and the quantum well layer is being interposed between the pair of second strain compensation layer to gradually relieve the strain of the quantum well layers, and wherein said first strain layers are different in composition from said second strain layers;

a capping layer formed on the multiple quantum well layer;

an optical pump radiating a pump beam to the surface of the capping layer;

an external cavity mirror separated from and facing the bottom DBR mirror; and barrier layers respectively interposed between the quantum well layers and the first strain compensation layers, and between the first and second strain compensation layers.

2. The VECSEL device of claim 1, wherein the multiple quantum well layer has a periodic gain structure.

3. The VECSEL device of claim 2, wherein the quantum well layer is formed of a material selected from the group consisting of InGaAs and GaInNAs.

4. The VECSEL device of claim 1, wherein the first and second strain compensation layers are formed of a material selected from the group consisting of GaAsP and GaNAs.

5. The VECSEL device of claim 1, wherein the capping layer is formed of $Al_xGa_{(1-x)}As$ ($0 \leq x < 1$).

6. The VECSEL device of claim 1, wherein the barrier layers are formed of $Al_yGa_{(1-y)}As$ ($0 \leq y < 0.08$).

7. The VECSEL device of claim 6, further comprising barrier layers respectively interposed between the lower DBR mirror and the multiple quantum well layer, and between the multiple quantum well layer and the capping layer.

* * * * *